(12) United States Patent
Lee et al.

(10) Patent No.: US 7,495,385 B2
(45) Date of Patent: Feb. 24, 2009

(54) FLAT PANEL DISPLAY

(75) Inventors: Kwan-Hee Lee, Yongin-si (KR);
Ja-Hyun Im, Yongin-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 434 days.

(21) Appl. No.: 11/287,378

(22) Filed: Nov. 28, 2005

(65) Prior Publication Data

US 2006/0113529 A1     Jun. 1, 2006

(30) Foreign Application Priority Data

Nov. 29, 2004   (KR) .................. 10-2004-0098877

(51) Int. Cl.
*H05B 33/00* (2006.01)

(52) U.S. Cl. .............. 313/504; 313/506; 313/112; 313/113; 348/800; 359/609; 257/98

(58) Field of Classification Search ............ None
See application file for complete search history.

(56) References Cited

U.S. PATENT DOCUMENTS

| | | | |
|---|---|---|---|
| 5,049,780 A | | 9/1991 | Dobrowolski et al. |
| 5,596,246 A * | | 1/1997 | Budzilek et al. ........... 313/502 |
| 6,326,224 B1 | | 12/2001 | Xu et al. |
| 6,639,250 B1 | | 10/2003 | Shimoda et al. |
| 2002/0093284 A1 * | | 7/2002 | Adachi et al. ............. 313/506 |
| 2003/0067266 A1 | | 4/2003 | Kim |
| 2004/0145303 A1 * | | 7/2004 | Yamada et al. ............. 313/504 |
| 2004/0195965 A1 | | 10/2004 | Yamazaki et al. |
| 2005/0099113 A1 * | | 5/2005 | Yamada ...................... 313/504 |
| 2005/0208330 A1 * | | 9/2005 | Raychaudhuri et al. ..... 428/690 |
| 2006/0006795 A1 * | | 1/2006 | Strip ......................... 313/504 |

FOREIGN PATENT DOCUMENTS

| | | |
|---|---|---|
| EP | 1 154 676 | 11/2001 |
| JP | 2002252082 | 9/2002 |
| JP | 2003-123987 | 4/2003 |
| JP | 2004152751 | 5/2004 |
| JP | 2004164890 | 6/2004 |
| WO | 0115246 | 3/2001 |
| WO | 03096758 | 11/2003 |
| WO | 03096757 | 11/2006 |

OTHER PUBLICATIONS

Boo Young Jung, et al., "Control of Resonant Wavelength from Organic Light-Emitting Materials by Use of a Fabry-Perot Microcavity Structure", Applied Optics, vol. 41, No. 16, Jun. 1, 2002, pp. 3312-3318.
Chinese Office Action mailed Aug. 1, 2008.

* cited by examiner

*Primary Examiner*—Ashok Patel
(74) *Attorney, Agent, or Firm*—H.C. Park & Associates, PLC

(57) ABSTRACT

A flat panel display includes a pixel electrode, an organic emission layer, an opposite electrode, a phase shift layer and a reflecting layer disposed on a substrate. The phase shift layer and the reflecting layer are stacked on the opposite electrode to destructively interfere with reflected external light to realize black and achieve excellent luminous efficiency.

20 Claims, 7 Drawing Sheets

FLAT PANEL DISPLAY

CROSS-REFERENCE TO RELATED APPLICATION

This application claims priority to and the benefit of Korean Patent Application No. 10-2004-0098877, filed on Nov. 29, 2004, which is hereby incorporated by reference for all purposes as if fully set forth herein.

BACKGROUND OF THE INVENTION

1. Field of the Invention

This invention relates to a flat panel display that has a phase shift layer and a reflecting layer stacked on an opposite electrode to destructively interfere with reflected external light to realize black. The invention also relates to a method of fabricating the flat panel display.

2. Discussion of the Background

An organic light emitting display (OLED) has a contrast ratio depending on the intensity of external light. A black matrix material may be employed to improve the contrast ratio, but it is very difficult to realize perfect black by shielding the external light in an emission region.

One device used in the prior art to attempt to solve this problem is a circular polarizer 140 shown in FIG. 1. U.S. Pat. No. 5,596,246 discloses an OLED that employs the circular polarizer 140. The OLED includes a circular polarizer 140, a lower substrate 100, a transparent first electrode 110, an organic emission layer 120, and a reflecting second electrode 130.

The circular polarizer 140 is employed to reduce the amount of external light that is reflected off a display panel. The circular polarizer 140 includes a linear polarizer 145 and a quarter compensating plate 141. Two axes of the quarter compensating plate 141 form a 45° angle to an axis of the linear polarizer 145. External light passes through the linear polarizer 145 and becomes linearly polarized. The quarter compensating plate 141 rotates the polarized light 45° spirally. The rotation direction of the polarized light is reversed after it is reflected from a reflecting layer of the display. The polarized light is rotated another 45° when it passes back through the quarter compensating plate 141. At this point, the polarized light is perpendicular to the linear polarizer and is therefore blocked by the linear polarizer 145.

Only about 44% of light emitted from the organic emission layer 120 passes through the circular polarizer 140. A large amount of light emitted from the organic emission layer 120 is absorbed by the circular polarizer 140, which causes the luminous efficiency and the contrast ratio to be low. To compensate for the reduced luminance, a relatively high voltage must be applied to achieve the desired luminance, which increases the power consumption and decreases the life span of the display. Furthermore, the manufacturing costs of the OLED are increased because the manufacturing process is complicated and the polarizer is expensive.

Another device used in the prior art to attempt to solve this problem was developed by Luxell Technologies Inc. Instead of a polarizer, Luxell incorporated an absorbing layer and a dielectric layer between an inorganic phosphorescent layer and an opposite electrode in an inorganic device. The method achieves black by destructive interference of external light and was disclosed in the *Journal of Military and Aerospace Electronics*, Volume 9, No. 6, June, 1998. But the method does not realize black to a satisfactory degree because the thickness of a thin film should be adjusted in consideration of the refractive index and absorptivity thereof.

SUMMARY OF THE INVENTION

The present invention provides a flat panel display with a phase shift layer and a reflective layer stacked on an opposite electrode to destructively interfere with reflected external light to realize black. The flat panel display has excellent luminous efficiency and contrast ratio, which lowers the required luminance and thus reduces power consumption and increases the life span of the display.

Additional features of the invention will be set forth in the description which follows, and in part will be apparent from the description, or may be learned by practice of the invention.

The present invention discloses a flat panel display that includes a pixel electrode disposed above a substrate, an organic layer disposed on the pixel electrode and having at least an emission layer, an opposite electrode disposed on the organic layer, a phase shift layer disposed on the opposite electrode, and a reflecting layer disposed on the phase shift layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
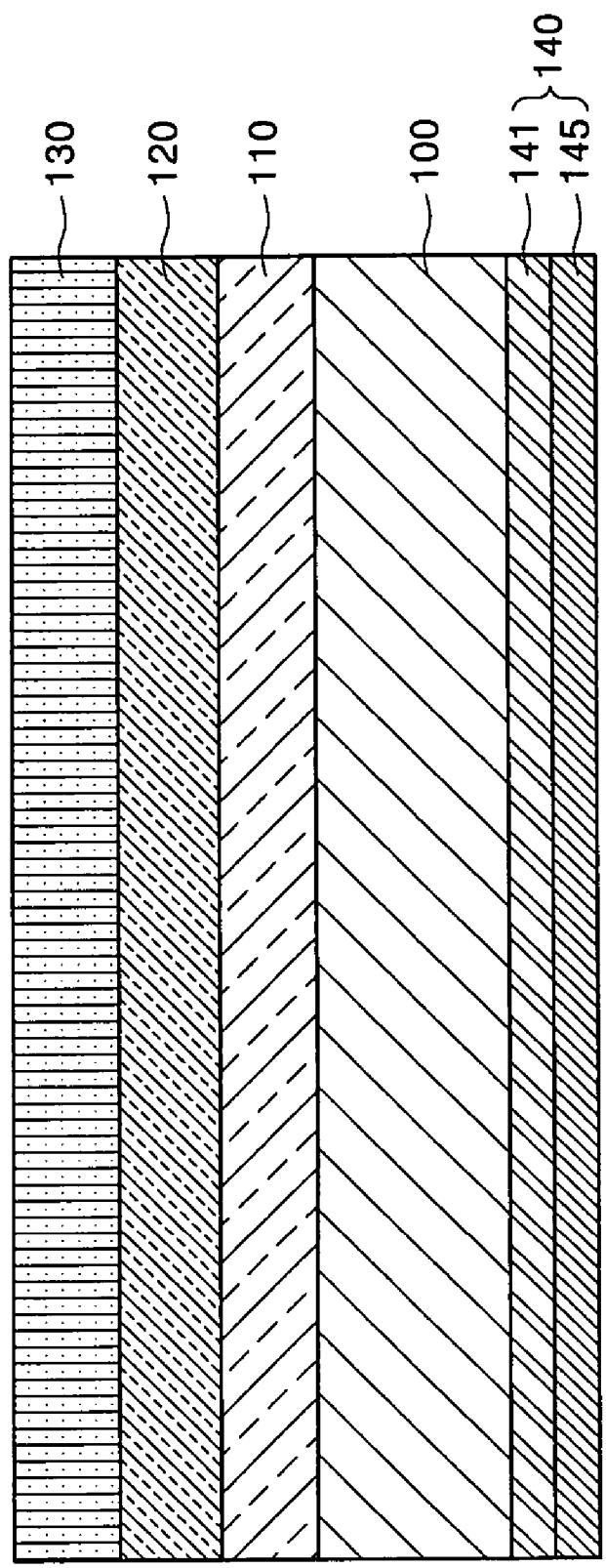
FIG. 1 shows a cross-sectional view of a conventional OLED having a circular polarizer.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
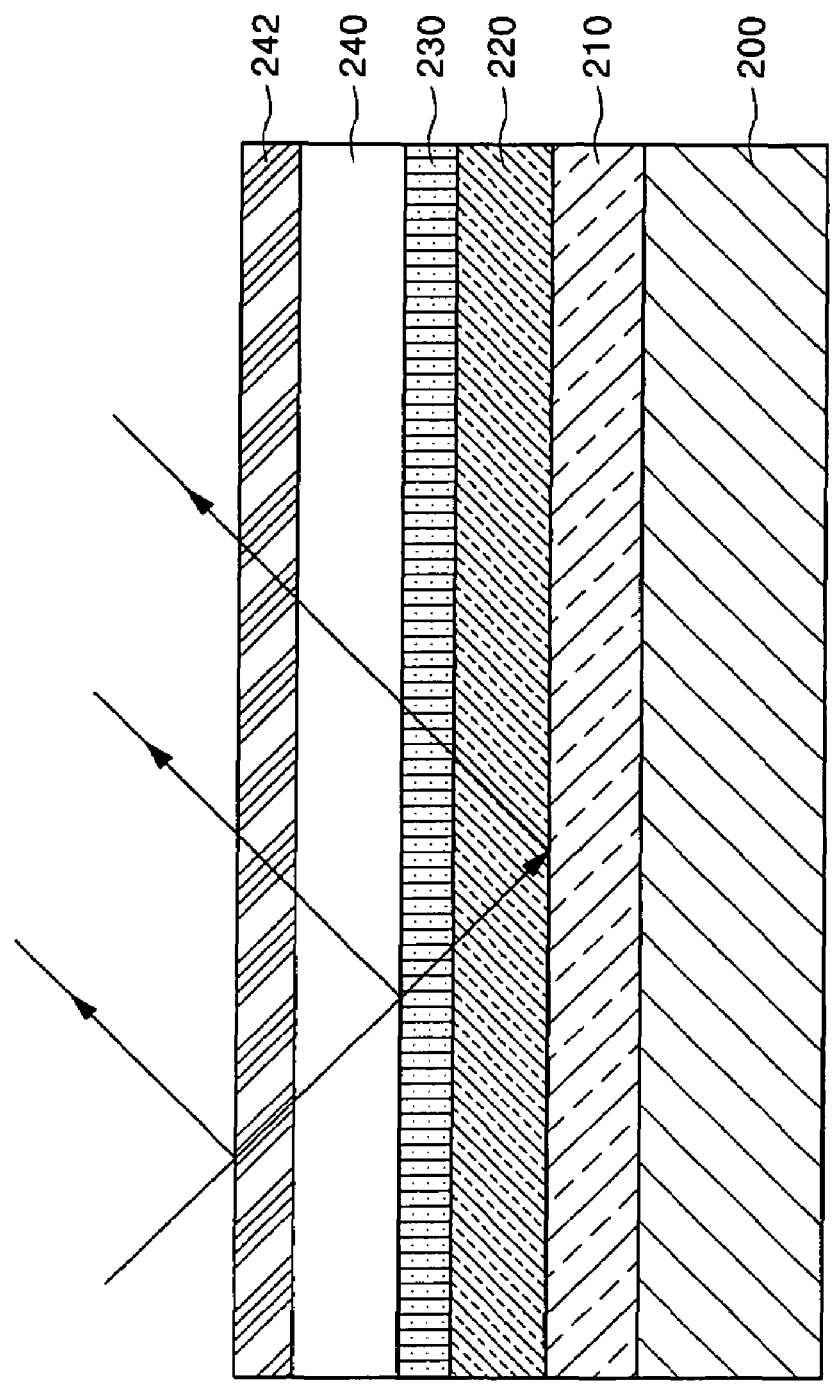
FIG. 2 shows a cross-sectional view of an OLED according to an exemplary embodiment of the present invention.

FIG. 2 shows a cross-sectional view of a flat panel display according to an exemplary embodiment of the present invention. The present invention may be applied to any type of flat panel display device. FIG. 2. shows an exemplary embodiment in which the flat panel display is an OLED.

A pixel electrode 210 is disposed on a substrate 200, an organic layer 220 having at least an emission layer is disposed on the pixel electrode 210, and an opposite electrode 230, a phase shift layer 240 and a reflecting layer 242 are sequentially disposed on the organic layer 220. A plurality of thin film transistors (TFTs) may be disposed between the substrate 200 and the pixel electrode 210.

The pixel electrode 210 is a reflecting electrode with a transparent conductive oxide (TCO) such as indium tin oxide (ITO) or indium zinc oxide (IZO) formed on a reflecting layer made of Al (Nd), an Al alloy, Ag, or an Ag alloy. The opposite electrode 230 may be made of one of Mg, MgAg, Ca, CaAg, Ag, AlCa, AlAg, LiMg, or Li. The opposite electrode 230 is about 150 Å to about 250 Å thick, and preferably is about 180 Å thick.

The phase shift layer 240 may be an organic layer, an inorganic layer, or a stacked structure of an organic layer and an inorganic layer layers. The phase shift layer 240 may be about 400 Å to about 1300 Å thick, and preferably is about 500 Å to about 800 Å thick. The phase shift layer 240 serves as a transparent layer that inverts the phase of light reflected from the opposite electrode 230 to create a phase shift. The phase shift creates an annihilation phenomenon that causes external reflected light to destroy itself.

The reflecting layer 242 may be a semi-transparent metal layer made of Mg, Ag, MgAg, Cr, Pt, or Au. The reflecting layer 242 may be about 60 Å to about 130 Å thick and preferably is about 80 Å to about 120 Å thick. The reflecting layer 242 should have a higher transmittance than the opposite electrode 230. The reflecting layer 242 may have a transmittance of about 40% to about 60%, and the opposite electrode 230 may have a transmittance of about 10% to about 40%.

A method of fabricating the OLED will now be explained below.

First, a pixel electrode 210 is disposed on a substrate 200. The pixel electrode 210 is a transparent electrode and may be made of a transparent conductive oxide (TCO) such as indium tin oxide (ITO) or indium zinc oxide (IZO). The pixel electrode 210 includes a reflecting layer (not shown) positioned below it. At least one thin film transistor (TFT) may be disposed between the transparent substrate 200 and the pixel electrode 210.

An organic layer 220 with at least an emission layer is formed on the pixel electrode 210. The organic layer 220 may also include one or more of a hole injection layer, a hole transport layer, a hole blocking layer, an electron transport layer, and an electron injection layer.

An opposite electrode 230 is formed on the organic layer 220. The opposite electrode 230 is a reflecting electrode layer and may be made of Mg, MgAg, Ca, CaAg, Ag, AlCa, AlAg, LiMg, or Li. The opposite electrode 230 may be about 150 Å to about 250 Å thick and preferably is about 180 Å thick.

A phase shift layer 240 is formed on the opposite electrode 230. The phase shift layer 240 serves to invert a phase of light reflected from the opposite electrode 230. The phase shift layer 240 may be about 400 Å to about 1300 Å thick, and preferably is about 500 Å to about 800 Å thick. The annihilation phenomenon does not occur when the thickness of the phase shift layer 240 falls outside the range of about 400 Å to about 1300 Å thick.

The phase shift layer 240 may be formed of an organic layer, an inorganic layer, or a stacked structure of layers. Any type of transparent organic layer may be used to form an organic phase shift layer 240. $SiN_x$, $SiO_2$, SiON, or transparent conductive oxide (TCO) may be used to form an inorganic phase shift layer 240.

A reflecting layer 242 is formed on the phase shift layer 240. The reflecting layer 242 may be a semi-transparent metal layer made of Mg, Ag, MgAg, Cr, Pt, or Au. The reflecting layer 242 may be about 50 Å to about 120 Å thick. The thickness of the reflecting layer 242 may be combined with the thickness of the phase shift layer 240 to create an optimal thickness to destructively interfere with and extinguish reflected external light. The reflecting layer 242 reflects external incident light to realize black by creating destructive interference with the phase-inverted light from the phase shift layer 240.

In an exemplary embodiment of the present invention, the phase shift layer 240 and the reflecting layer 242 are patterned only on an emission region of the OLED.

Figure 3:
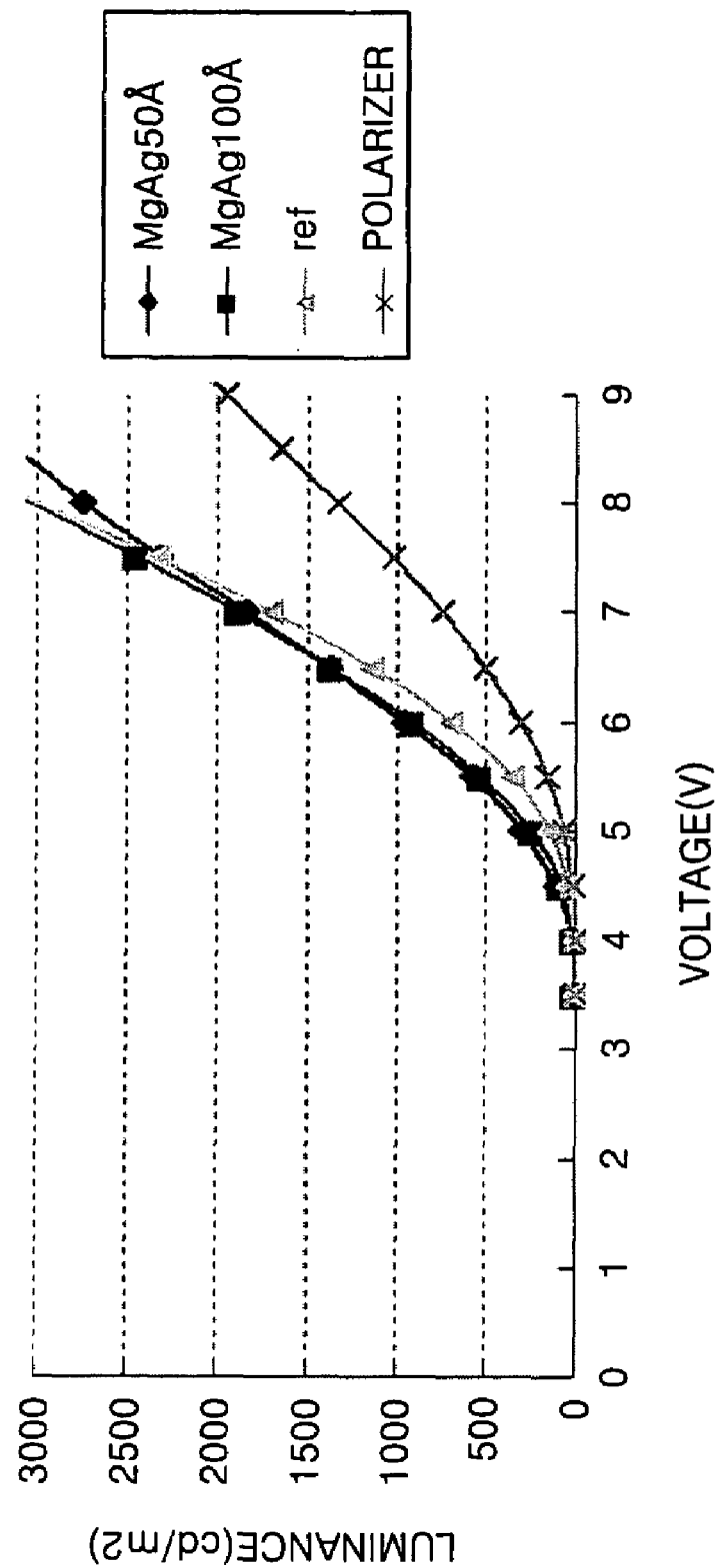
FIG. 3 shows a graph illustrating the luminance of an OLED according to an exemplary embodiment of the present invention.

FIG. 3 shows a graph illustrating the luminance versus the voltage applied to a group of OLEDs. The graph in FIG. 3 shows the luminance of an OLED where the phase shift layer 240 is formed of an organic or inorganic material on an opposite electrode and the reflecting layer 242 is formed of MgAg on the phase shift layer. The graph in FIG. 3 shows luminance data for an OLED with a reflecting layer that is 50 Å (MgAg50 Å) and 100 Å (MgAg100 Å) thick. The graph in FIG. 3 also shows luminance data for an OLED on which a polarizer is employed (POLARIZER).

Referring to FIG. 3, it can be seen that an OLED that employs a phase shift layer 240 and a reflecting layer 242 is much higher in luminance than an OLED on which only a polarizer is employed. It can be also seen that an OLED that employs a reflecting layer 242 that is 50 Å thick is similar in luminance to one where the reflecting layer 242 is 100 Å thick.

Figure 4:
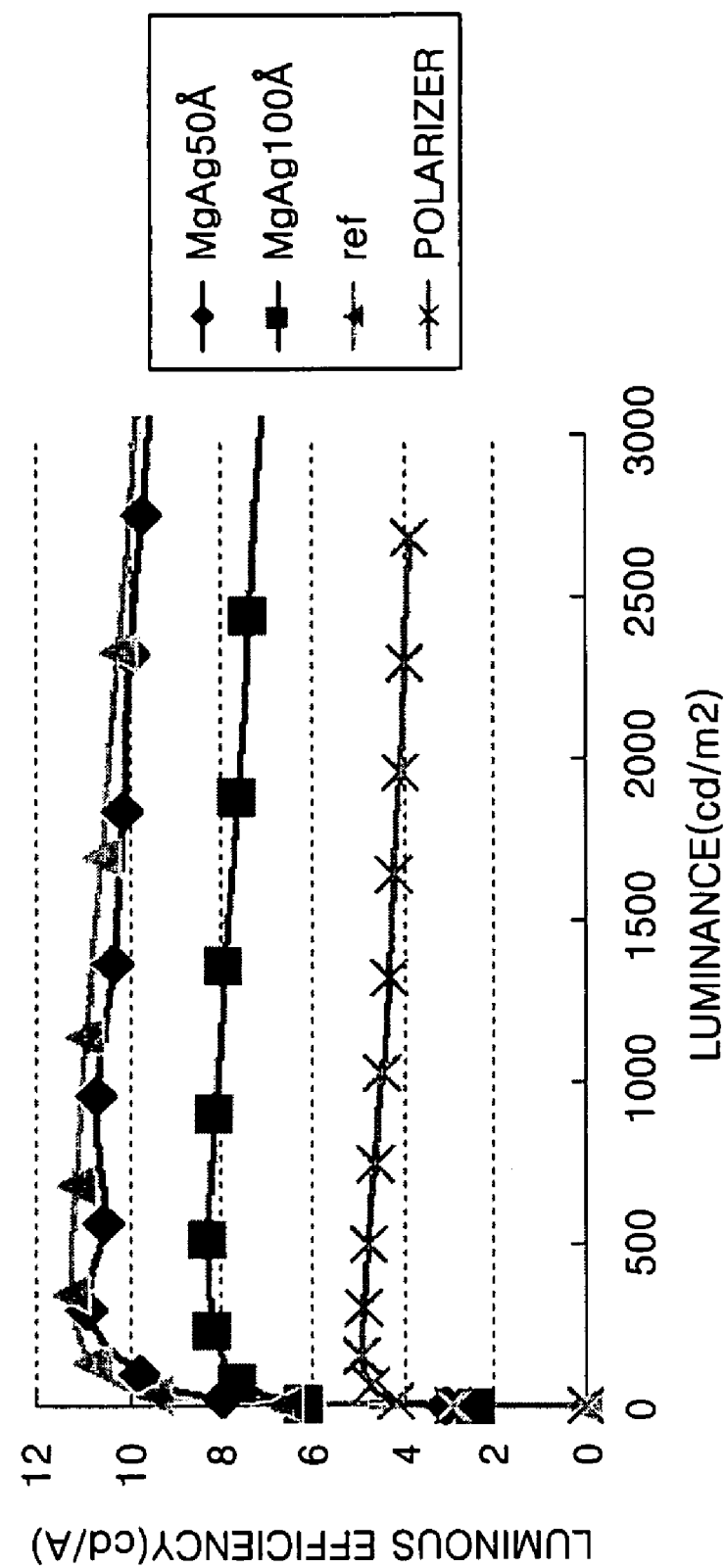
FIG. 4 shows a graph illustrating the luminous efficiency of an OLED according to an exemplary embodiment of the present invention.

FIG. 4 shows a graph illustrating luminous efficiency versus luminance for the same group of OLEDs shown in FIG. 3. It can be seen that an OLED that uses a phase shift layer 240 and a reflecting layer 242 (MgAg50 Å and MgAg100 Å) is much higher in luminous efficiency than in an OLED on which a polarizer is employed (POLARIZER).

An example of an embodiment of the present invention will now be described below. The embodiment is given as an example to further understanding of the present invention, but the scope of the present invention is not limited to the embodiment described.

Embodiment 1

An OLED was formed as follows. A pixel electrode 210 was formed on a substrate 200. An organic emission layer 220 was formed on the pixel electrode 210. The organic emission layer 220 was made to different thicknesses according to its color. Red and green emission layers were 400 Å thick, and a blue emission layer was 150 Å thick. An electron transport layer about 250 Å to about 300 Å thick was formed as part of the emission layer. An opposite electrode 230, 180 Å thick was formed on the organic layer 220. A phase shift layer 240, 500 Å to 800 Å thick was formed on the opposite electrode 230. A reflecting layer 242, 80 Å to 120 Å thick was formed on the phase shift layer 240. The luminous efficiency of Embodiment 1 is shown in Table 1.

COMPARATIVE EXAMPLE 1

An OLED was formed in the same way as Embodiment 1 except that a reflecting layer 242 was excluded. The luminous efficiency of Comparative Example 1 is shown in Table 1.

COMPARATIVE EXAMPLE 2

An OLED was formed in the same way as Embodiment 1 except that a polarizer was formed on the opposite electrode instead of a phase shift layer 240 and a reflecting layer 242. The luminous efficiency of Comparative Example 2 is shown in Table 1.

TABLE 1

|  | Red | Green | Blue |
| --- | --- | --- | --- |
| Embodiment 1 | 8 cd/A | 28 cd/A | 1.4 cd/A |
| Comparison 1 | 11 cd/A | 56 cd/A | 1.8 cd/A |
| Comparison 2 | 4.8 cd/A | 24 cd/A | 0.8 cd/A |

As shown in Table 1, the luminous efficiency of Embodiment 1 is 170% in red, 116% in green and 175% in blue, compared to Comparative Example 2.

Figure 5A:
FIG. 5A, FIG. 5B, and FIG. 5C shows photographs of OLEDs which realize different degrees of black.
Figure 5B:
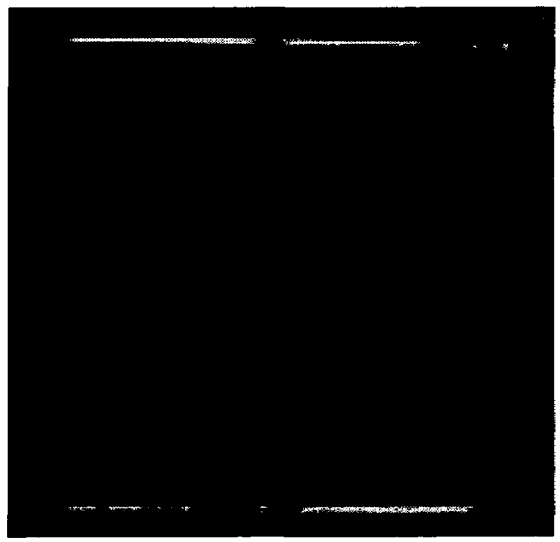
Figure 5C:

FIG. 5A, FIG. 5B, and FIG. 5C show photographs illustrating OLEDs with different degrees of embodied blacks. FIG. 5A shows the embodied black when only a phase shift layer is stacked on an opposite electrode. FIG. 5B and FIG. 5C show the embodied black when a phase shift layer and a reflecting layer are stacked on an opposite electrode. The reflecting layer of FIG. 5B is 50 Å thick, and the reflecting layer of FIG. 5C is 100 Å thick. It can be seen that black, shown in the center of the photograph, is best realized when the reflecting layer is 100 Å thick.

Figure 6:
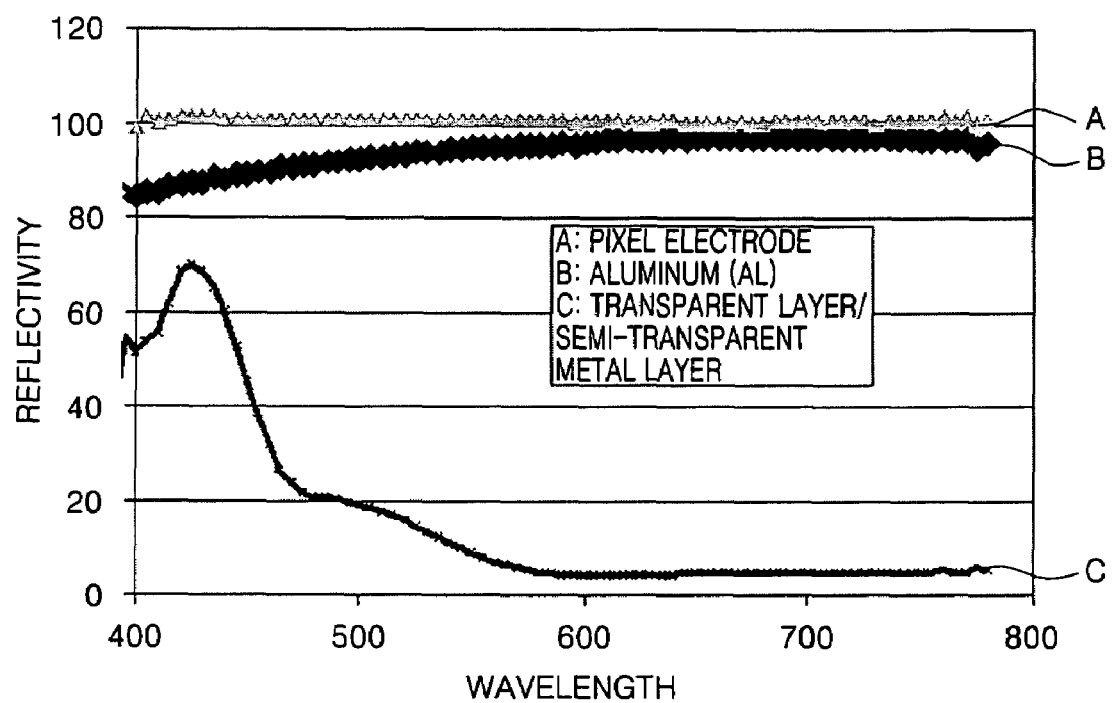
FIG. 6 shows a graph illustrating the reflectivity of an OLED according to an exemplary embodiment of the present invention.

FIG. 6 shows a graph illustrating the reflectivity of various wavelengths of light of an OLED according to an exemplary embodiment of the present invention. In FIG. 6, "A" denotes the reflectivity of a pixel electrode alone, "B" denotes the reflectivity of aluminum (Al) alone, and "C" denotes the reflectivity of an opposite electrode with a phase shift layer 240 and a reflecting layer 242 stacked upon it.

As can be seen in FIG. 6, reflected external light is significantly reduced when the phase shift layer and the reflecting layer are stacked on the opposite electrode.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A flat panel display, comprising:
    a pixel electrode disposed above a substrate;
    an organic layer including an emission layer disposed on the pixel electrode;
    an opposite electrode disposed on the organic layer;
    a phase shift layer disposed on the opposite electrode; and
    a reflecting layer to reflect external incident light, the reflecting layer being disposed on the phase shift layer.

2. The flat panel display of claim 1, further comprising at least one thin film transistor disposed between the substrate and the pixel electrode.

3. The flat panel display of claim 1, wherein the pixel electrode is a reflecting electrode.

4. The flat panel display of claim 1, wherein the organic layer further includes at least one additional layer selected from the group of a hole injection layer, a hole transport layer, a hole blocking layer, an electron transport layer, and an electron injection layer.

5. The flat panel display of claim 1, wherein the opposite electrode is formed of a material with a transmittance of about 10% to about 40%.

6. The flat panel display of claim 1, wherein the opposite electrode is formed of a material selected from the group of Mg, MgAg, Ca, CaAg, Ag, AlCa, AlAg, LiMg, and Li.

7. The flat panel display of claim 1, wherein the opposite electrode is about 150 Å to about 250 Å thick.

8. The flat panel display of claim 7, wherein the opposite electrode is about 180 Å thick.

9. The flat panel display of claim 1, wherein the phase shift layer is about 400 Å to about 1300 Å thick.

10. The flat panel display of claim 9, wherein the phase shift layer is about 500 Å to about 800 Å thick.

11. The flat panel display of claim 1, wherein the phase shift layer is a transparent layer.

12. The flat panel display of claim 11, wherein the transparent layer is an organic layer, an inorganic layer, or a stacked structure of an organic layer and an inorganic layer.

13. The flat panel display of claim 12, wherein the inorganic layer is formed of a material selected from the group of silicon nitride ($SiN_x$), silicon oxide ($SiO_2$), silicon oxynitride (SiON), and a transparent conductive oxide (TCO).

14. The flat panel display of claim 1, wherein the reflecting layer is formed of a material that has a transmittance of about 40% to about 60%.

15. The flat panel display of claim 1, wherein the reflecting layer is a semi-transparent metal layer.

16. The flat panel display of claim 15, wherein the semi-transparent metal layer is formed of a material selected from the group of Mg, Ag, MgAg, Cr, Pt, and Au.

17. The flat panel display of claim 1, wherein the reflecting layer is about 80 Å to about 120 Å thick.

18. The flat panel display of claim 1, wherein the phase shift layer is directly on the opposite electrode.

19. The flat panel display of claim 18, wherein the reflecting layer is directly on the phase shift layer.

20. The flat panel display of claim 1, wherein the flat panel display does not comprise a polarizer.

* * * * *